United States Patent
Kwon et al.

(10) Patent No.: US 8,618,648 B1
(45) Date of Patent: *Dec. 31, 2013

(54) METHODS FOR FLIP CHIP STACKING

(75) Inventors: Woon-Seong Kwon, Cupertino, CA (US); Suresh Ramalingam, Fremont, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/548,041

(22) Filed: Jul. 12, 2012

(51) Int. Cl.
*H01L 23/02* (2006.01)
*H01L 23/48* (2006.01)
*H01L 23/52* (2006.01)
*H01L 29/40* (2006.01)
*H01L 21/00* (2006.01)

(52) U.S. Cl.
USPC ........... 257/686; 257/737; 257/738; 257/778; 257/678; 257/621; 257/774; 257/E23.011; 257/E23.067; 257/E25.013; 257/E21.499; 257/E21.503; 438/108; 438/109

(58) Field of Classification Search
USPC .......... 257/621, 686, 737, E21.503, E23.067, 257/E21.511, E21.499, E23.069, 738, 778, 257/678, 727, 774, E23.011, E25.013; 438/106, 108, 109, 464; 361/234
See application file for complete search history.

(56) References Cited

U.S. PATENT DOCUMENTS

| | | | |
|---|---|---|---|
| 1,526,757 A | 2/1925 | Mueller | |
| 5,583,736 A * | 12/1996 | Anderson et al. | 361/234 |
| 5,791,486 A | 8/1998 | Brahmbhatt | |
| 6,271,107 B1 | 8/2001 | Massingill et al. | |
| 6,482,677 B2 | 11/2002 | Sato et al. | |
| 6,501,636 B1 * | 12/2002 | Savas et al. | 361/234 |
| 7,034,401 B2 | 4/2006 | Savastiouk et al. | |
| 7,208,342 B2 | 4/2007 | Lee et al. | |
| 7,233,061 B1 | 6/2007 | Conn | |
| 7,348,215 B2 * | 3/2008 | Lee | 438/108 |
| 7,566,960 B1 | 7/2009 | Conn | |
| 7,842,548 B2 | 11/2010 | Lee et al. | |
| 7,863,092 B1 | 1/2011 | Chaware et al. | |
| 8,062,968 B1 | 11/2011 | Conn | |
| 8,313,982 B2 | 11/2012 | Dunne et al. | |
| 2001/0027933 A1 | 10/2001 | Sasamura et al. | |
| 2004/0061207 A1 | 4/2004 | Ding | |
| 2007/0018300 A1 | 1/2007 | Ryu et al. | |
| 2008/0284037 A1 | 11/2008 | Andry et al. | |
| 2009/0085202 A1 | 4/2009 | Dang et al. | |
| 2009/0194872 A1 | 8/2009 | Wang et al. | |
| 2009/0263214 A1 | 10/2009 | Lee et al. | |
| 2009/0321948 A1 | 12/2009 | Wang et al. | |

(Continued)

OTHER PUBLICATIONS

U.S. Appl. No. 13/548,029, filed Jul. 12, 2012, Kwon et al.
Au, K. Y. et al., "Multi Chip Stacking & Reliability Challenges using TSV-Micro C4 Solder Interconnection for FCCSP TSV Package," *Proc. of the 2011 IEEE 13th Electronics Packaging Technology Conference*, Dec. 7, 2011, pp. 608-619, IEEE, Piscataway, NJ, USA.

(Continued)

*Primary Examiner* — Mary Wilczewski
*Assistant Examiner* — Erik T Peterson
(74) *Attorney, Agent, or Firm* — Gerald Chan; Lois D. Cartier

(57) ABSTRACT

A cavity wafer for flip chip stacking includes an electrostatic (ESC) chuck wafer with a plurality of cavities, and a bonding layer on a surface of the ESC chuck wafer. The bonding layer is configured to receive a through-silicon-via (TSV) interposer with solder bumps. The plurality of cavities are configured to receive the solder bumps at the TSV interposer. The bonding layer is configured to receive an electrostatic bias for bonding the ESC chuck wafer to the TSV interposer with the solder bumps.

18 Claims, 8 Drawing Sheets

(56) References Cited

U.S. PATENT DOCUMENTS

| | | |
|---|---|---|
| 2010/0261313 A1 | 10/2010 | Toh et al. |
| 2011/0035937 A1* | 2/2011 | Lu et al. .................. 29/829 |
| 2011/0089552 A1 | 4/2011 | Park et al. |
| 2011/0193228 A1 | 8/2011 | Yu et al. |
| 2011/0221072 A1 | 9/2011 | Chin |
| 2012/0032286 A1 | 2/2012 | Trusov et al. |
| 2012/0032326 A1 | 2/2012 | Kim et al. |
| 2012/0098114 A1 | 4/2012 | Ishibashi |
| 2012/0104623 A1 | 5/2012 | Pagaila et al. |
| 2012/0133048 A1 | 5/2012 | Lee et al. |
| 2012/0211885 A1 | 8/2012 | Choi et al. |

OTHER PUBLICATIONS

Sunohara, Masahiro et al., "Silicon Interposer with TSVs (Through Silicon Vias) and Fine Multilayer Wiring," *Proc, of the 2008 Electronic Components and Technology Congerence*, May 27, 2008, pp. 847-852, IEEE, Piscataway, NJ, USA.

Yoon, Seung Wook et al., "3D TSV Mid-End Processes and Assembly/Packaging Technology," *Proc. of the 2011 18th European Microelectronics and Packaging Conference*, Sep. 12, 2011, pp. 1-6, IEEE, Piscataway, NJ, USA.

* cited by examiner

METHODS FOR FLIP CHIP STACKING

TECHNICAL FIELD

An embodiment described herein relates generally to flip chip stacking, and in particular to methods for stacking a flip chip that includes a through-silicon-via (TSV) interposer, an integrated circuit (IC) die, and an organic substrate.

BACKGROUND

Conventional approaches for performing flip chip stacking involve placing a through-silicon-via (TSV) interposer on an organic substrate and subsequently stacking an integrated circuit on the TSV interposer to form a flip chip. Such conventional methods for flip chip stacking are characterized by the particular bonding methods and process parameters involved. Assembly yield for flip chip stacking is significantly influenced by TSV interposer warpage that occurs during conventional flip chip stacking. Conventional flip chip stacking approaches lead to significant amounts of TSV interposer warpage that ultimately affects IC performance and assembly yield.

One approach for mitigating the effects of TSV interposer warpage may be thermo-compression bonding of IC dies to TSV interposers. However, thermo-compression bonding may lead to several side effects such as flux residue and uneven heat profiles, which in turn may result in poor soldering performance.

SUMMARY

In accordance with some embodiments, a method for flip chip stacking includes forming a cavity wafer, wherein the cavity wafer comprises an electrostatic (ESC) chuck wafer, a plurality of cavities within the ESC chuck wafer, and a bonding layer on a surface of the ESC chuck wafer, placing a through-silicon-via (TSV) interposer with solder bumps coupled to a surface of the TSV interposer on the cavity wafer, such that the solder bumps are situated in the plurality of cavities and the TSV interposer is situated on the bonding layer, applying an electrostatic bias to the bonding layer to bond the TSV interposer to the cavity wafer, placing an integrated circuit (IC) die on another surface of the TSV interposer, such that the IC die, the TSV interposer, and the solder bumps form a stacked interposer unit, and removing the stacked interposer unit from the cavity wafer.

In one or more embodiments, the method further includes bonding the solder bumps at the stacked interposer unit to an organic substrate such that the stacked interposer unit and the organic substrate form a flip chip.

In one or more embodiments, the organic substrate comprises underlying circuitry.

In one or more embodiments, the act of bonding the solder bumps at the stacked interposer unit to the organic substrate comprises performing reflow joining.

In one or more embodiments, the bonding layer comprises an electrostatic carrier layer.

In one or more embodiments, the act of forming the cavity wafer comprises forming the electrostatic carrier layer on the ESC chuck wafer, patterning photoresist on the electrostatic carrier layer, performing a reactive ion dry etch of the ESC chuck wafer or the electrostatic carrier layer with the patterned photoresist, and removing the photoresist.

In one or more embodiments, the bonding layer further comprises a dielectric layer, the electrostatic carrier layer situated between the dielectric layer and the surface of the ESC chuck wafer.

In one or more embodiments, the act of forming the cavity wafer comprises forming the electrostatic carrier layer on the ESC chuck wafer, patterning photoresist on the electrostatic carrier layer, performing a reactive ion dry etch of the ESC chuck wafer or the electrostatic carrier layer with the patterned photoresist, removing the photoresist, and forming the dielectric layer on the electrostatic carrier layer.

In one or more embodiments, the method further includes performing reflow joining to attach the IC die to the other surface of the TSV interposer.

In one or more embodiments, the method further includes performing underfilling after the reflow joining is performed.

In one or more embodiments, the act of removing the stacked interposer unit from the cavity wafer comprises removing the electrostatic bias applied to the bonding layer.

In one or more embodiments, the method further includes melting IC solder bumps associated with the IC die.

In one or more embodiments, the method further includes placing another integrated circuit (IC) die on the TSV interposer.

In other embodiments, a cavity wafer for flip chip stacking includes an electrostatic (ESC) chuck wafer with a plurality of cavities, and a bonding layer on a surface of the ESC chuck wafer, wherein the bonding layer is configured to receive a through-silicon-via (TSV) interposer with solder bumps, and the plurality of cavities are configured to receive the solder bumps at the TSV interposer, and wherein the bonding layer is configured to receive an electrostatic bias for bonding the ESC chuck wafer to the TSV interposer with the solder bumps.

In one or more embodiments, the bonding layer comprises an electrostatic carrier layer.

In one or more embodiments, the bonding layer further comprises a dielectric layer, the electrostatic carrier layer situated between the dielectric layer and the surface of the ESC chuck wafer.

In one or more embodiments, the TSV interposer with the solder bumps is removable from the cavity wafer in response to a removal of the electrostatic bias applied to the bonding layer.

In one or more embodiments, the cavity wafer is reusable for performing multiple instances of flip chip stacking.

In one or more embodiments, the cavity wafer is compatible with any thermal process.

Other and further aspects and features will be evident from reading the following detailed description of the embodiments

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered which are illustrated in the accompanying drawings. These drawings depict only typical embodiments and are not therefore to be considered limiting of the scope of the claims.

FIG. 2 is a flow diagram illustrating a method for flip chip stacking according to some embodiments.

FIGS. 3-1 to 3-12 are cross-sectional views illustrating a method for flip chip stacking according to some embodiments.

DETAILED DESCRIPTION

Figure 1:
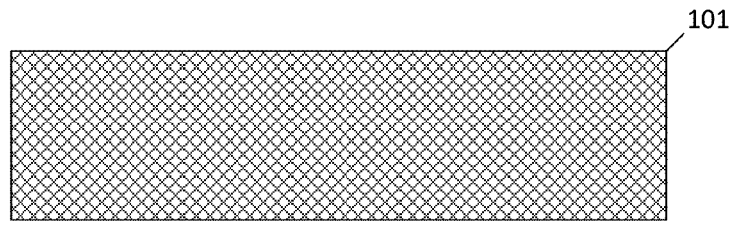
FIGS. 1-1 to 1-5 are cross-sectional views illustrating a method for flip chip stacking.

Various embodiments are described hereinafter with reference to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiments, even if not so illustrated, or if not explicitly described. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

FIGS. 1-1 to 1-5 are cross-sectional views illustrating an approach for flip chip stacking. Initially an organic substrate 101 is formed as illustrated in FIG. 1-1. The organic substrate 101 may include underlying circuitry and various external pads (not shown) for forming connections to the underlying circuitry.

Figures 1, 2:
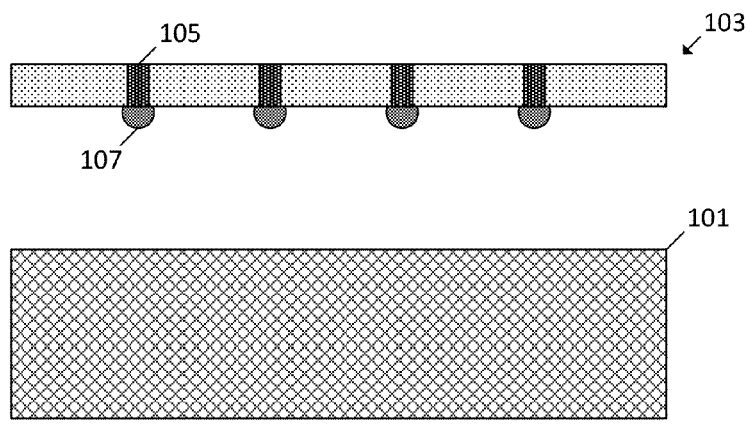

A through-silicon-via (TSV) interposer 103 may then be placed on the organic substrate 101 as illustrated in FIG. 1-2. The TSV interposer includes a plurality of vias 105 that extend from a top surface of the TSV interposer 103 to a bottom surface of the TSV interposer 103 to allow for connections to be made between the top surface and bottom surface. The bottom surface of the TSV interposer 103 is coupled to corresponding solder bumps 107. The solder bumps 107 are coupled to the vias 105 of the TSV interposer 103 to allow for connections to be made to the vias 105. The solder bumps 107 may correspond to external pads (not shown) of the organic substrate 101, such that connections may be formed to the underlying circuitry of the organic substrate 101 through the TSV interposer 103.

Figures 1, 2, 3:
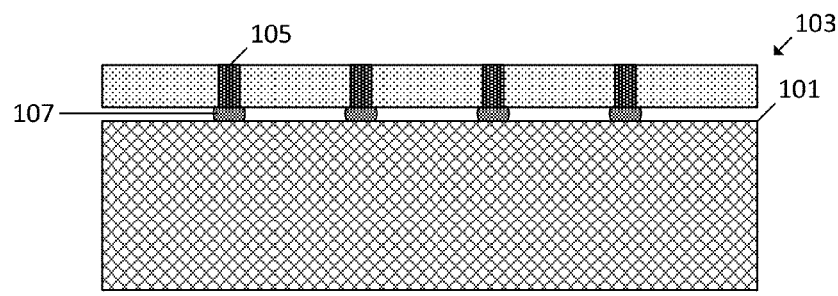

FIG. 1-3 illustrates the TSV interposer 103 after it has been placed on the organic substrate 101. In order to place the TSV interposer 103 on the organic substrate and form connections between vias 105 of the TSV interposer and external pads (not shown) of the organic substrate 101, a process may be used to melt the solder bumps 107 in order to form connections between the TSV interposer 103 and the organic substrate 101.

A plurality of integrated circuit dies 109 may then be placed on the top surface of the TSV interposer 109 to form a flip chip as illustrated in FIG. 1-4. The integrated circuit dies 109 may include IC solder bumps 111 coupled to a bottom surface to form connections between the underlying circuitry of the integrated circuit dies 109 and the vias 105 of the TSV interposer 103.

FIG. 1-5 illustrates the flip chip after the integrated circuit dies 109 have been placed on the top surface of the TSV interposer 103. In order to place the integrated circuit dies 109 on the organic substrate 101 and form connections between vias 105 of the TSV interposer and the IC dies 109, a process may be used to melt the solder bumps or copper pillar bumps 111 in order to form connections between the TSV interposer 103 and the IC dies 109.

Because of the lack of mechanical support provided by the organic substrate 101 during the process of placing the integrated circuit dies 109 on the TSV interposer 103, the TSV interposer 103 suffers from warpage as illustrated in FIG. 1-5. The amount of TSV interposer 103 warpage affects IC performance, with small amounts of warpage leading to some degradation of IC performance and large amounts of warpage ultimately leading to completely ineffective IC performance. This in turn affects assembly yield, as flip chips that suffer from severe TSV interposer warpage will be discarded and not used.

FIG. 2 is a flow diagram illustrating a method for stacking a flip chip according to some embodiments. The method of FIG. 2 eliminates the warpage issue associated with the previously described flip chip stacking approach to accomplish high assembly yield.

Initially a cavity wafer comprising a plurality of cavities within an electrostatic (ESC) chuck wafer and a bonding layer on a surface of the ESC chuck wafer is formed as described at 201. The cavity wafer may be formed by first forming an electrostatic carrier layer on an ESC chuck wafer. The electrostatic carrier layer may be deposited on a surface of the ESC chuck wafer using any known deposition techniques. The electrostatic carrier layer may then be coated with photoresist which is patterned to define the plurality of cavities. A reactive ion dry etch of the ESC chuck wafer and the electrostatic carrier layer may then be performed to form the plurality of cavities. Optionally, a dielectric layer may be formed over the electrostatic carrier layer and the plurality of cavities.

In embodiments where the cavity wafer comprises only the electrostatic carrier layer, the ESC carrier layer will be referred to as the bonding layer. In embodiments where the cavity wafer comprises both the electrostatic carrier layer and the dielectric layer, the combination of the ESC carrier layer and the dielectric layer will be referred to as the bonding layer.

A TSV interposer with solder bumps coupled to a surface of the TSV interposer is placed on the cavity wafer as described at 203. The TSV interposer includes a plurality of vias. The vias extend from a top surface of the TSV interposer to a bottom surface of the TSV interposer to allow for connections to be made between the top surface and bottom surface. The bottom surface of the TSV interposer is coupled to corresponding solder bumps to allow for connections to be made to the vias.

The TSV interposer with solder bumps is placed on the cavity wafer such that the solder bumps are situated in the plurality of cavities and the TSV interposer is situated on the bonding layer.

An electrostatic bias is then applied to the bonding layer to bond the TSV interposer with solder bumps to the cavity wafer as described at 205. In embodiments where the bonding layer comprises both the electrostatic carrier layer and the dielectric layer, the electrostatic bias may be applied to the electrostatic carrier layer. In embodiments where the bonding layer comprises only the electrostatic carrier layer, the electrostatic bias may be applied to the electrostatic carrier layer.

The electrostatic bias causes the electrostatic carrier layer to generate an electrical force which causes the TSV interposer to become bonded to the TSV interposer. By applying the electrostatic bias, the TSV interposer may be mechanically stabilized such that it is immune from warpage during subsequent flip chip stacking.

An integrated circuit (IC) die is then placed on another surface of the TSV interposer to form a stacked interposer unit as described at 207. The integrated circuit (IC), TSV interposer, and solder bumps form the stacked interposer unit. In some embodiments, underfilling may be performed after placing the IC die on the other surface of the TSV, such that the IC, TSV interposer, solder bumps, and underfilling together form the stacked interposer unit.

In some embodiments, a process may be used to melt IC solder bumps coupled to the IC dies in order to form connections between the TSV interposer and the IC dies (e.g., reflow joining). In some embodiments, a single IC die may be placed on the other surface of the TSV interposer. In other embodiments, more than one IC die may be placed on the surface of the TSV interposer. This method for flip chip stacking allows flexibility in the configuration (e.g., number of IC dies) of the stacked interposer unit.

Because the TSV interposer and solder bumps are mechanically stabilized by the plurality of cavities and the electrical force generated by applying an electrostatic bias to the bonding layer, placing the integrated circuit die on the surface of the TSV interposer to form a stacked interposer unit will not cause warpage to occur to the TSV interposer.

The stacked interposer unit (e.g., integrated circuit, TSV interposer, and solder bumps) is then removed from the cavity wafer as described at 209. The electrical bias being applied to the bonding layer of the cavity wafer may be turned off, thereby causing the electrical force that causes the TSV interposer to become bonded to the TSV interposer to be dissipated. Once the electrical bias has been turned off, the stacked interposer unit may be easily removed from the cavity wafer.

Once the stacked interposer unit has been removed, the solder bumps of the stacked interposer unit may then be bonded to an organic substrate to form a flip chip as described at 211. In some embodiments, the stacked interposer unit may be bonded to the organic substrate by a process known as reflow joining. The stacked interposer unit (e.g., IC dies, TSV interposer, and solder bumps) and the organic substrate together form the flip chip. The organic substrate may include underlying circuitry and various external pads for forming connections to its underlying circuitry. The solder bumps may correspond to external pads of the organic substrate, such that connections may be formed from the IC dies to the underlying circuitry of the organic substrate through the TSV interposer.

By introducing a cavity wafer with a plurality of cavities and a bonding layer that generates an electrical force in response to an electrical bias for bonding a TSV interposer with solder bumps to the cavity wafer during the process of placing IC dies on the TSV interposer, the TSV interposer may be shielded from warpage, thereby improving IC die performance and assembly yield in comparison to conventional flip chip stacking approaches. Moreover, utilizing an electrical force to provide mechanical stabilization eliminates the need for using polymeric materials for mechanical stabilization and also eliminates the subsequent costly cleaning process of using polymeric materials. Additionally, the cavity wafer is reusable and fully compatible with any thermal processes such as chip bonding, reflow joining, and underfilling.

FIGS. 3-1 to 3-12 are cross-sectional views illustrating a method for flip chip stacking according to some embodiments. Initially an electrostatic (ESC) chuck wafer 301 is provided as illustrated in FIG. 3-1. The ESC chuck wafer 301 is used to form a cavity wafer which will be used to provide mechanical stabilization to a TSV interposer with solder bumps during the process of placing IC dies on the TSV interposer, which will be described in further detail below.

An electrostatic carrier layer 303 may then be deposited on the ESC chuck wafer 301 as illustrated in FIG. 3-2. The electrostatic carrier layer 303 may be deposited using any known deposition technique. The electrostatic carrier layer 303 is configured to generate an electrical force when an electrostatic bias is applied to it. The electrical force will provide mechanical stabilization to a TSV interposer with solder bumps during the process of placing IC dies on the TSV interposer.

The ESC chuck wafer 301 with the electrostatic carrier layer 303 may then be coated with photo-resist 305 which is patterned to define a plurality of cavities as illustrated in FIG. 3-3. In some embodiments, the photo-resist may comprise positive resist material that becomes soluble when exposed to light. In other embodiments, the photo-resist may comprise negative resist material that becomes insoluble when exposed to light. One ordinarily skilled in the art will recognize that many different techniques and materials may be used to pattern a photo-resist layer which defines the plurality of cavities.

Figures 1, 2, 3, 4:
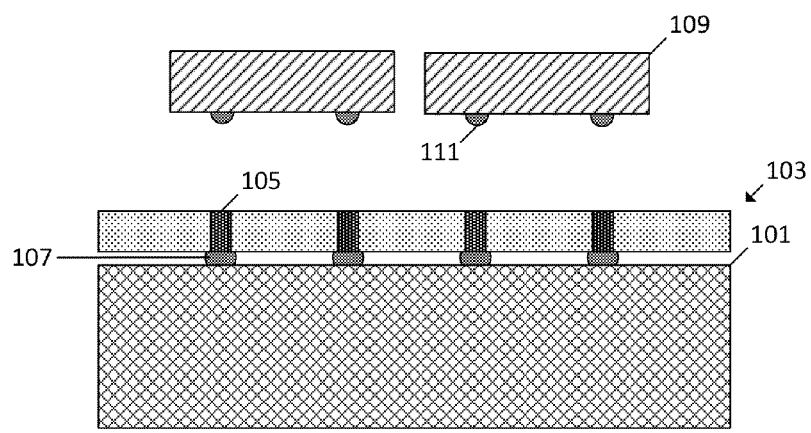

A reactive ion dry etch of the ESC chuck wafer 301 or the electrostatic carrier layer 303 may then be performed to form the plurality of cavities 307 as illustrated in FIG. 3-4. One ordinarily skilled in the art will recognize that other techniques may be used to form the plurality of cavities 307.

Figures 1, 2, 3, 4, 5:
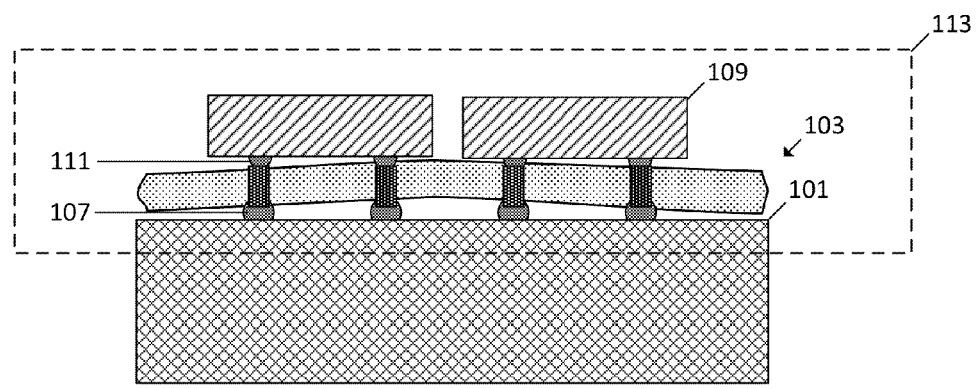
Figure 2:
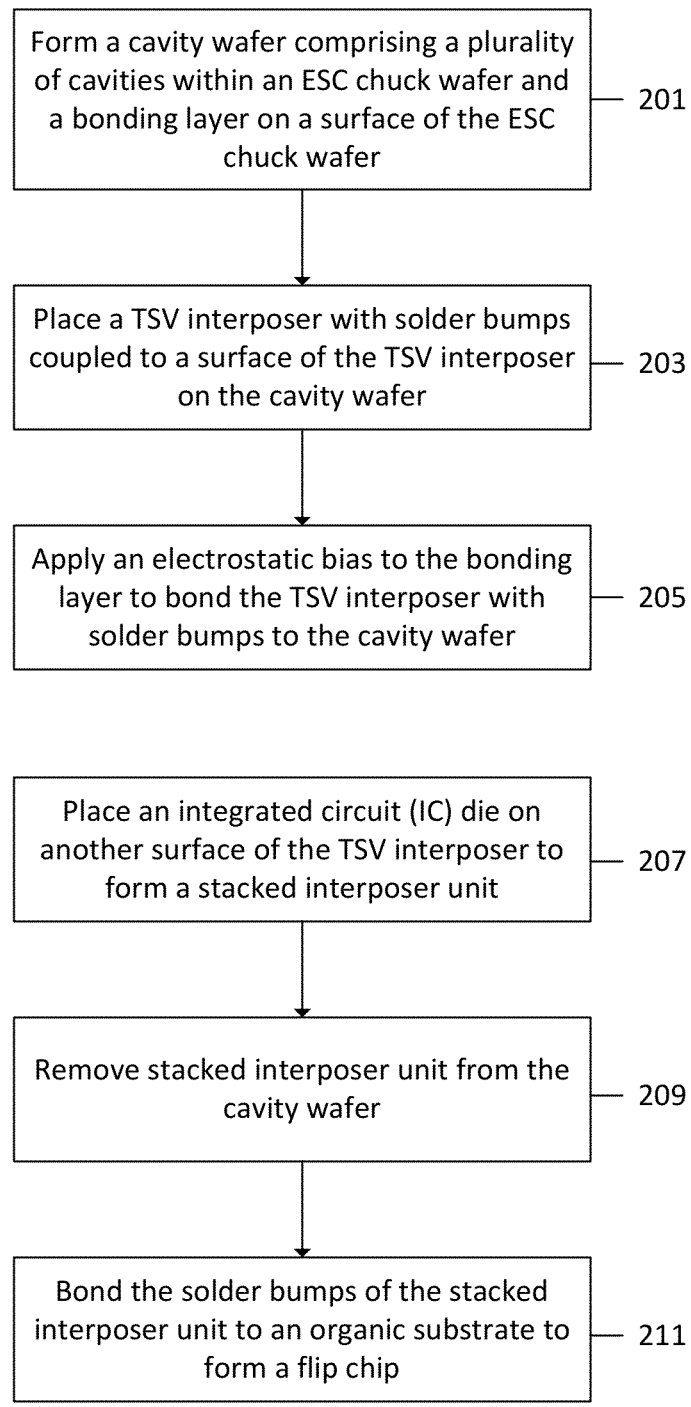
Figures 1, 3:
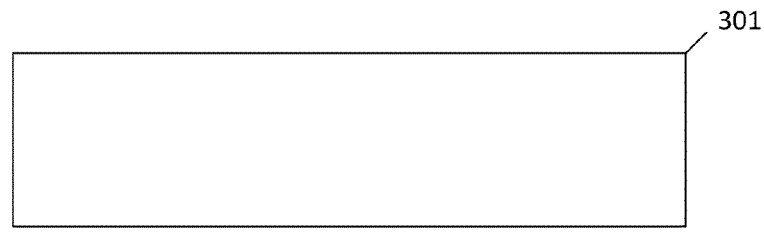
Figures 2, 3:
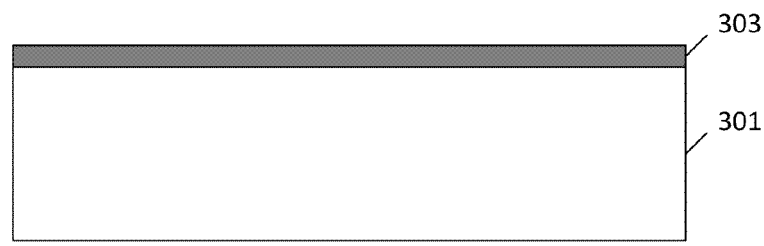
Figure 3:
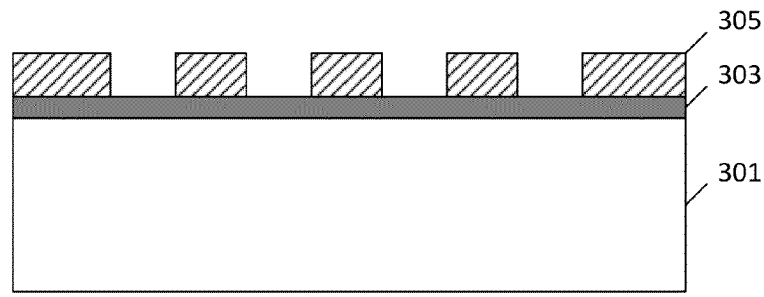
Figures 3, 4:
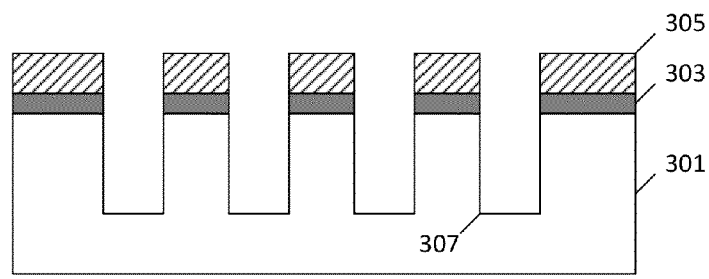
Figures 3, 4, 5:
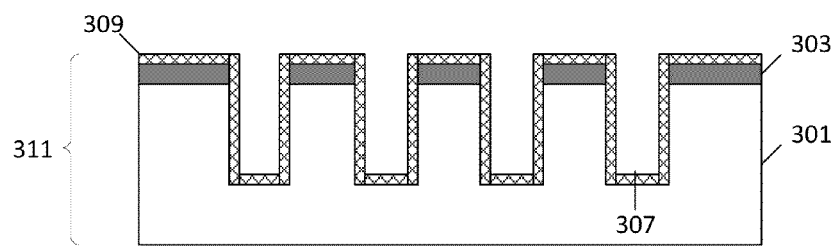
Figures 3, 4, 5, 6:
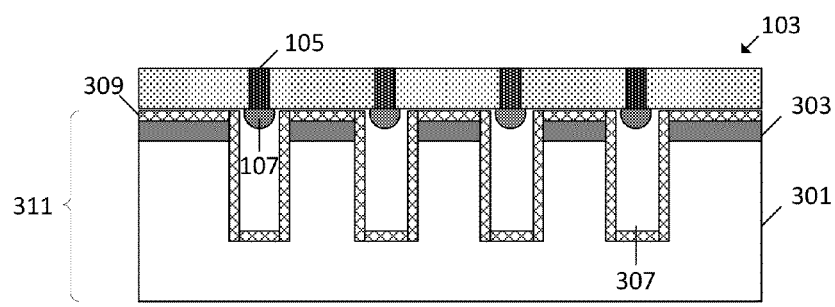
Figures 3, 4, 5, 6, 7:
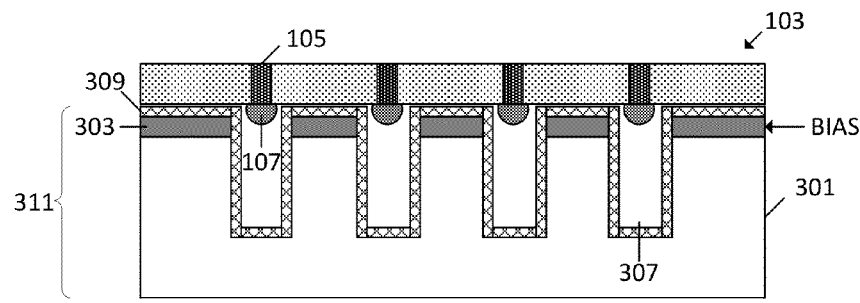
Figures 3, 4, 5, 6, 7, 8:
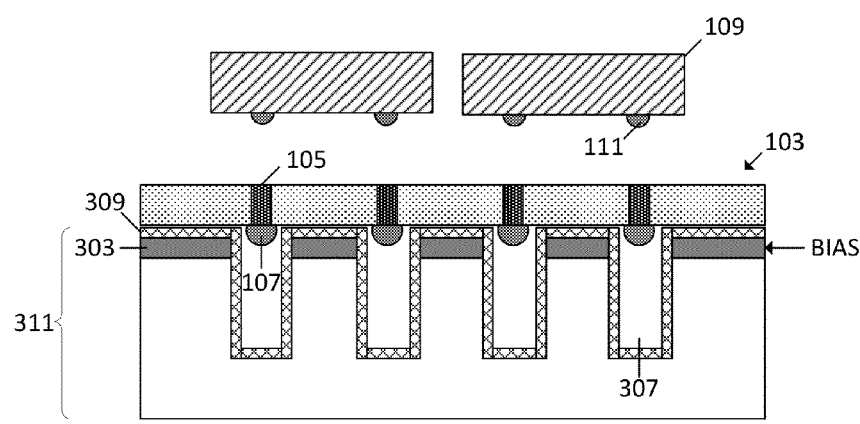
Figures 3, 4, 5, 6, 7, 8, 9:
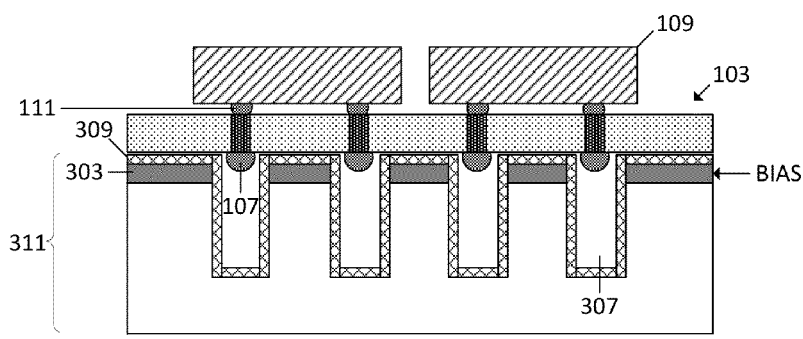
Figures 3, 4, 5, 6, 7, 8, 9, 10:
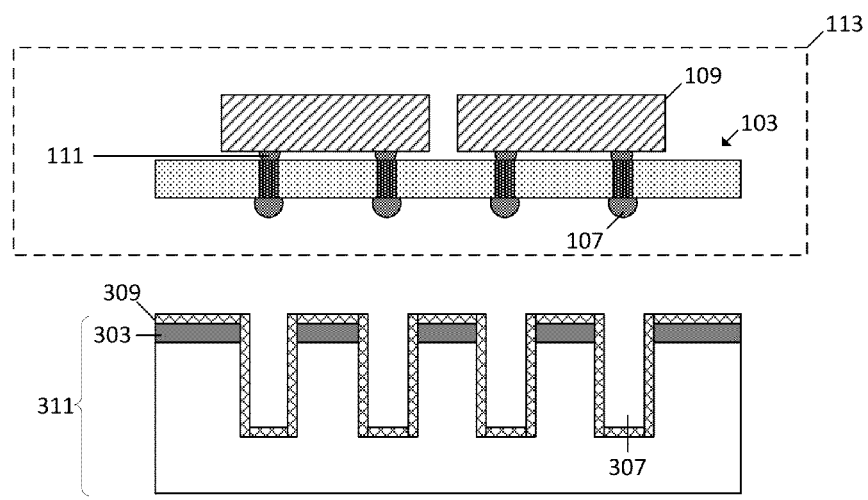
Figures 3, 4, 5, 6, 7, 8, 9, 10, 11:
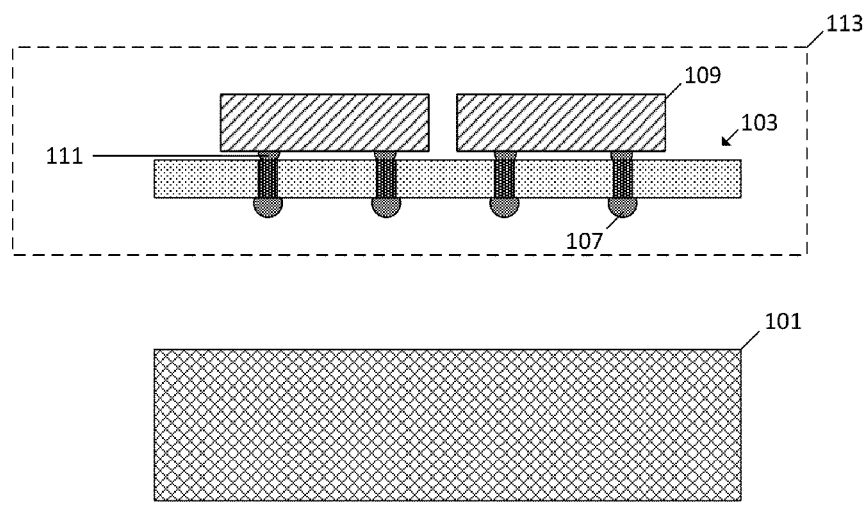
Figures 3, 4, 5, 6, 7, 8, 9, 10, 11, 12:
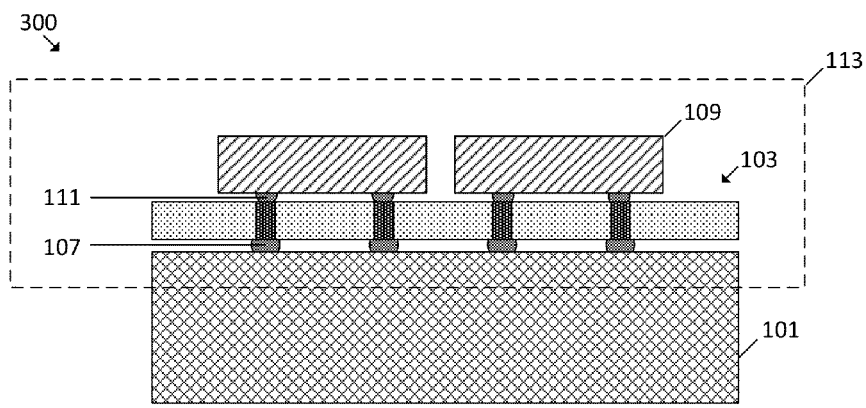

The photo-resist 305 may then be removed and a dielectric layer 309 may optionally be formed over the electrostatic carrier layer 303 and the plurality of cavities 307 as illustrated in FIG. 3-5. The combination of the electrostatic carrier layer 303 and the dielectric layer 309 will be referred to as the bonding layer. The combination of the ESC chuck wafer 301, the plurality of cavities 307, and the bonding layer 303, 309 form the cavity wafer 311.

A TSV interposer 103 with solder bumps 107 coupled to a bottom surface of the TSV interposer 103 is then placed on the cavity wafer as illustrated in FIG. 3-6. It should be noted that within the context of the subject application, when a first item (e.g., the TSV interposer) is described as being placed "on" a second item (e.g., the cavity wafer), the first item may contact the second item) in which case, the first item may be considered as directly "on" the second item), or the first item may not contact the second item (such as in the situation in which there is a third item between the first and second items, in which case the first item may be considered as indirectly "on" the second item).

The TSV interposer 103 includes a plurality of vias 105 that extend from a top surface of the TSV interposer 103 to a bottom surface of the TSV interposer 103 to allow for connections to be made between the top surface and bottom surface. The bottom surface of the TSV interposer 103 is couple to corresponding solder bumps 107. The solder bumps 107 are coupled to the vias 105 of the TSV interposer 103 to allow for connections to be made to the vias 105. The solder bumps 107 may correspond to external pads of an external component (e.g., organic substrate), such that connections may be formed to the underlying circuitry of the external component through the TSV interposer 103.

The TSV interposer 103 and solder bumps 107 are placed on the cavity wafer 311 such that the solder bumps 107 are situated in the plurality of cavities 307 and the TSV interposer 103 is situated on the bonding layer (e.g., electrostatic carrier layer 303 and dielectric layer 309).

An electrostatic bias is then applied to the bonding layer (e.g., electrostatic carrier layer 303 and dielectric layer 309) to bond the TSV interposer 103 with solder bumps 107 to the cavity wafer 311 as illustrated in FIG. 3-7. The electrostatic bias may be applied to the electrostatic carrier layer 303 of the bonding layer (e.g., electrostatic carrier layer 303 and dielectric layer 309).

The electrostatic bias causes the electrostatic carrier layer 303 to generate an electrical force which causes the TSV interposer 103 to become bonded to the cavity wafer 311. By applying the electrostatic bias, the TSV interposer 103 may be mechanically stabilized such that it is immune from warpage during subsequent flip chip stacking.

One or more IC dies 109 may then be placed on the TSV interposer 103 as illustrated in FIG. 3-8. The integrated circuit dies 109 may include IC solder bumps 111 coupled to a bottom surface to form connections between the underlying circuitry of the integrated circuit dies 109 and the vias 105 of the TSV interposer 103. In some embodiments, the IC solder bumps 111 may be copper pillar bumps.

FIG. 3-9 illustrates the integrated circuit dies 109 after they have been placed on the top surface of the TSV interposer 103. The integrated circuit dies 109, TSV interposer 103, and solder bumps 107 together form a stacked interposer unit 113. In some embodiments, underfilling may be performed after placing the IC dies 109 on the other surface of the TSV, such that the IC dies 109, TSV interposer 103, solder bumps 107, and underfilling (not shown) together form the stacked interposer unit 113. In order to place the integrated circuit dies 109 on the organic substrate 101 and form connections between vias 105 of the TSV interposer and the IC dies 109, a process known as reflow joining may be used to melt the IC solder bumps 11 to form connections between the TSV interposer 103 and the IC dies 109.

The stacked interposer unit 113 may then be removed from the cavity wafer 311 as illustrated in FIG. 3-10. The electrical bias being applied to the electrostatic carrier layer 303 of the cavity wafer 311 may be turned off, thereby causing the electrical force that causes the TSV interposer 113 to become bonded to the cavity wafer 311 to be dissipated. Once the electrical bias has been turned off, the stacked interposer 113 unit may be easily removed from the cavity wafer 311.

The stacked interposer unit 113 may then be bonded to an organic substrate 101, as illustrated in FIG. 3-11. As discussed above, the organic substrate 101 may include underlying circuitry and various external pads (not shown) for forming connections to the underlying circuitry. The stacked interposer unit 113 may be placed such that solder bumps 107 correspond to external pads (not shown) of the organic substrate 101 so that connections may be formed from the IC dies to the underlying circuitry of the organic substrate 101 through the TSV interposer 103.

FIG. 3-12 illustrates the stacked interposer unit 113 after it has been bonded to the organic substrate 101. The stacked interposer unit 113 (e.g., IC dies 109, TSV interposer 103, and solder bumps 107) and the organic substrate 101 together form the flip chip 300. In some embodiments, a process known as reflow joining may be used to melt solder bumps 107 coupled to the bottom surface of the TSV interposer 103 in order to form connections between the TSV interposer 103 and the organic substrate 101.

As discussed above, by introducing a cavity wafer with a plurality of cavities and a bonding layer that generates an electrical force for bonding a TSV interposer with solder bumps to the cavity wafer when an electrical bias is applied during the process of placing IC dies on the TSV interposer, the TSV interposer may be shielded from warpage, thereby improving IC die performance and assembly yield in comparison to conventional flip chip stacking approaches. Moreover, utilizing an electrical force to provide mechanical stabilization eliminates the need for using polymeric materials for mechanical stabilization and also eliminates the subsequent costly cleaning process of using polymeric materials. Additionally, the cavity wafer is reusable and fully compatible with any thermal processes such as chip bonding, reflow joining, and underfilling.

Although particular embodiments have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. A method for flip chip stacking, comprising:
    forming a cavity wafer by forming a plurality of cavities within an electrostatic (ESC) chuck wafer and forming a bonding layer on a surface of the ESC chuck wafer;
    placing a through-silicon-via (TSV) interposer with solder bumps coupled to a surface of the TSV interposer on the cavity wafer, such that the solder bumps are situated in the plurality of cavities and the TSV interposer is situated on the bonding layer;
    applying an electrostatic bias to the bonding layer to bond the TSV interposer to the cavity wafer;
    placing an integrated circuit (IC) die on another surface of the TSV interposer, such that the IC die, the TSV interposer, and the solder bumps form a stacked interposer unit; and
    removing the stacked interposer unit from the cavity wafer.

2. The method of claim 1, further comprising bonding the solder bumps at the stacked interposer unit to an organic substrate such that the stacked interposer unit and the organic substrate form a flip chip.

3. The method of claim 2, wherein the organic substrate comprises underlying circuitry.

4. The method of claim 2, wherein the act of bonding the solder bumps at the stacked interposer unit to the organic substrate comprises performing reflow joining.

5. The method of claim 1, wherein the bonding layer comprises an electrostatic carrier layer.

6. The method of claim 5, wherein the act of forming the cavity wafer comprises:
    forming the electrostatic carrier layer on the ESC chuck wafer;
    patterning photoresist on the electrostatic carrier layer;
    performing a reactive ion dry etch of the ESC chuck wafer or the electrostatic carrier layer with the patterned photoresist; and
    removing the photoresist.

7. The method of claim 5, wherein the bonding layer further comprises a dielectric layer, the electrostatic carrier layer situated between the dielectric layer and the surface of the ESC chuck wafer.

8. The method of claim 7, wherein the act of forming the cavity wafer comprises:
    forming the electrostatic carrier layer on the ESC chuck wafer;
    patterning photoresist on the electrostatic carrier layer;
    performing a reactive ion dry etch of the ESC chuck wafer or the electrostatic carrier layer with the patterned photoresist;
    removing the photoresist; and
    forming the dielectric layer on the electrostatic carrier layer.

9. The method of claim 1, further comprising performing reflow joining to attach the IC die to the other surface of the TSV interposer.

10. The method of claim 9, further comprising performing underfilling after the reflow joining is performed.

11. The method of claim 1, wherein the act of removing the stacked interposer unit from the cavity wafer comprises removing the electrostatic bias applied to the bonding layer.

12. The method of claim 1, further comprising melting IC solder bumps associated with the IC die.

13. The method of claim 1, further comprising placing another integrated circuit (IC) die on the TSV interposer.

14. A system for flip chip stacking, comprising:
- an electrostatic (ESC) chuck wafer having a plurality of cavities in the ESC chuck wafer; and
- a bonding layer on a surface of the ESC chuck wafer; and
- a through silicon via (TSV) interposer with solder bumps coupled to a surface of the TSV interposer, wherein the solder bumps are situated in the plurality of cavities; and
- an integrated circuit (IC) die on another surface of the TSV interposer, wherein the IC die and the TSV interposer with the solder bumps form a stacked interposer unit;
- wherein the bonding layer has one or more surfaces above which the through-silicon-via interposer with the solder bumps is situated;
- wherein the cavities have respective dimensions and positions for allowing the cavities to receive the solder bumps of the TSV interposer;
- wherein the ESC chuck wafer is bonded to the TSV interposer with the solder bumps in response to the bonding layer receiving an electrostatic charge; and
- wherein the TSV interposer with the solder bumps is removable from the cavities in response to a removal of the electrostatic charge applied to the bonding layer.

15. The system of claim 14, wherein the bonding layer comprises an electrostatic carrier layer.

16. The system of claim 15, wherein the bonding layer further comprises a dielectric layer, the electrostatic carrier layer situated between the dielectric layer and the surface of the ESC chuck wafer.

17. The system of claim 14, wherein the ESC chuck wafer is reusable for performing multiple instances of flip chip stacking.

18. The system of claim 14, wherein the ESC chuck wafer is compatible with a chip bonding process, a reflow joining process, or an underfilling process.

* * * * *